US009620386B2

(12) United States Patent
Tsai et al.

(10) Patent No.: US 9,620,386 B2
(45) Date of Patent: *Apr. 11, 2017

(54) METHODS OF ANNEALING AFTER DEPOSITION OF GATE LAYERS (71) Applicant: TAIWAN SEMICONDUCTOR MANUFACTURING COMPANY, LTD., Hsinchu (TW)

(72) Inventors: Chun Hsiung Tsai, Xinpu Township (TW); Xiong-Fei Yu, Hsinchu (TW); Yu-Lien Huang, Jhubei (TW); Da-Wen Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/444,706

(22) Filed: Jul. 28, 2014

(65) Prior Publication Data

US 2014/0335685 A1 Nov. 13, 2014

Related U.S. Application Data

(63) Continuation of application No. 13/183,909, filed on Jul. 15, 2011, now Pat. No. 8,809,175.

(51) Int. Cl.
*H01L 21/28* (2006.01)
*H01L 29/40* (2006.01)
*H01L 21/324* (2006.01)
*H01L 29/51* (2006.01)
*H01L 29/66* (2006.01)
(Continued)

(52) U.S. Cl.
CPC ...... *H01L 21/324* (2013.01); *H01L 21/28088* (2013.01); *H01L 21/28176* (2013.01); *H01L 21/28185* (2013.01); *H01L 29/401* (2013.01); *H01L 29/511* (2013.01); *H01L 29/513* (2013.01); *H01L 29/517* (2013.01);
(Continued)

(58) Field of Classification Search
USPC .......................................... 438/926, 652–653
See application file for complete search history.

(56) References Cited

U.S. PATENT DOCUMENTS 7,037,863 B2 * 5/2006 Doh ................. H01L 21/28185
257/E21.267
7,947,610 B2 5/2011 Tsunashima et al.
(Continued)

OTHER PUBLICATIONS

Rahman et al., "Enhanced Reliability and Performance of High-k MOSFET by Two-Step Annealing", 2006, Electrochemical and Solid-State Letters, vol. 9, pp. G127-G129.

*Primary Examiner* — Fernando L Toledo
*Assistant Examiner* — Valerie N Newton
(74) *Attorney, Agent, or Firm* — Hauptman Ham, LLP (57) ABSTRACT

A method of fabricating a gate structure includes depositing a high dielectric constant (high-k) dielectric layer over a substrate. The method further includes performing a multi-stage preheat high-temperature anneal. Performing the multi-stage preheat high-temperature anneal includes performing a first stage preheat at a temperature in a range from about 400° C. to about 600° C., performing a second stage preheat at a temperature in a range from about 700° C. to about 900° C., and performing a high temperature anneal at a peak temperature in a range from 875° C. to about 1200° C.

20 Claims, 8 Drawing Sheets

(51) Int. Cl.
*H01L 29/49* (2006.01)
*H01L 29/78* (2006.01)

(52) U.S. Cl.
CPC .... *H01L 29/66545* (2013.01); *H01L 29/4966* (2013.01); *H01L 29/7833* (2013.01)

(56) References Cited

U.S. PATENT DOCUMENTS

| | | | |
|---|---|---|---|
| 8,809,175 B2 * | 8/2014 | Tsai | H01L 21/28088 438/591 |
| 2007/0152271 A1 * | 7/2007 | Dewey et al. | 257/346 |
| 2009/0142899 A1 | 6/2009 | Jensen et al. | |
| 2010/0041242 A1 | 2/2010 | Lim et al. | |
| 2011/0195570 A1 | 8/2011 | Lin et al. | |
| 2011/0298053 A1 | 12/2011 | Zhong et al. | |
| 2012/0049247 A1 | 3/2012 | Lee et al. | |
| 2012/0074498 A1 | 3/2012 | Chunag et al. | |

* cited by examiner

| wafer# | 1st-stage preheat T(°C) | 1st-stage preheat t(s) | 2nd-stage preheat T(°C) | 2nd-stage preheat t(s) | RTA anneal T(°C) | RTA anneal $T_{peak-sec}$ (s) | $\dfrac{\Delta Nit}{\Delta Nit_{w01}}$ |
|---|---|---|---|---|---|---|---|
| w01 | 600 | 10 | NA | NA | 800 | 30 | 1.00 |
| w04 | 600 | 10 | 750 | 10 | 875 | 1.5 | 0.91 |
| w05 | 600 | 10 | 750 | 10 | 900 | 1.5 | 0.79 |
| w06 | 600 | 10 | 750 | 10 | 925 | 1.5 | 0.60 |
| w08 | 600 | 10 | 800 | 10 | 875 | 1.5 | 1.05 |
| w09 | 600 | 10 | 750 | 20 | 875 | 1.5 | 1.12 |
| w10 | 600 | 10 | 750 | 30 | 875 | 1.5 | 0.91 |
| w11 | 600 | 10 | 750 | 10 | 875 | 5 | 0.70 |
| w12 | 600 | 10 | 750 | 10 | 875 | 10 | 0.60 |

| wafer# or split# | 1st-stage preheat T (°C) | 1st-stage preheat t (s) | 2nd-stage preheat T (°C) | millisecond Anneal t (s) | millisecond Anneal T (°C) | millisecond Anneal t (ms) | $\Delta Nit / \Delta Nit_{ref}$ |
|---|---|---|---|---|---|---|---|
| w01 (reference) | 600 | 10 | NA | NA | 800 (RTA) | 30 (s) (RTA) | 1.00 |
| SP1 | 600 | 10 | 750 | 4 (2/2) | 1000 | 2 | 0.88 |
| SP2 | 600 | 10 | 750 | 4 (2/2) | 1000 | 9 | 1.34 |
| SP3 | 600 | 10 | 800 | 4 (2/2) | 1050 | 2 | 0.86 |
| SP4 | 600 | 10 | 800 | 4 (2/2) | 1050 | 9 | 0.70 |
| SP5 | 600 | 10 | 850 | 4 (2/2) | 1100 | 9 | 0.47 |

METHODS OF ANNEALING AFTER DEPOSITION OF GATE LAYERS

PRIORITY CLAIM

The present application is a continuation of U.S. application Ser. No. 13/183,909, filed Jul. 15, 2011, which is incorporated herein by reference in its entirety.

FIELD

The present disclosure relates generally to methods of fabricating semiconductor devices and, more specifically, to annealing after deposition of gate layers.

BACKGROUND

The semiconductor integrated circuit (IC) industry has experienced rapid growth. Technological advances in IC materials and designs have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional densities (i.e., the number of interconnected devices per chip area) have generally increased while geometry sizes (i.e., the smallest component or line that can be created using a fabrication process) have decreased. Such scaling-down process generally provides benefits by increasing production efficiency and lowering associated costs.

In the scaling trend, various materials have been used for the gate electrode and gate dielectric in forming the field effect transistors (FET). One approach is to fabricate these devices with a metal material for the gate electrode and a high-dielectric-constant (high-k) dielectric for the gate dielectric. However, high-k metal gate (HKMG) devices often require additional layers in the gate structure. For example, work function layers may be used to tune the work function values of the metal gates. The HKMG devices may suffer from device performance issues due to the shrinking dimensions and processing methods.

DETAILED DESCRIPTION

The present disclosure relates generally to forming a semiconductor device on a substrate and, more particularly, to a gate replacement process and a semiconductor device which include a modified profile metal gate structure. It is understood, however, that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

Figure 1A:
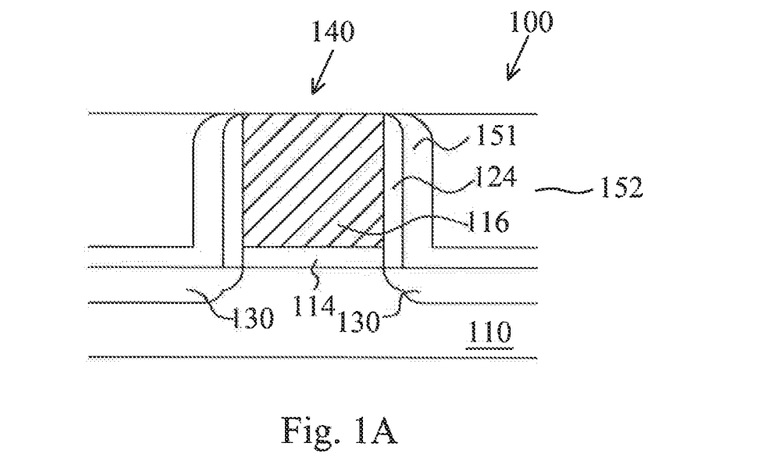
FIGS. 1A-1C show cross-sectional views of processing a semiconductor device structure, in accordance with some embodiments.
Figure 1B:
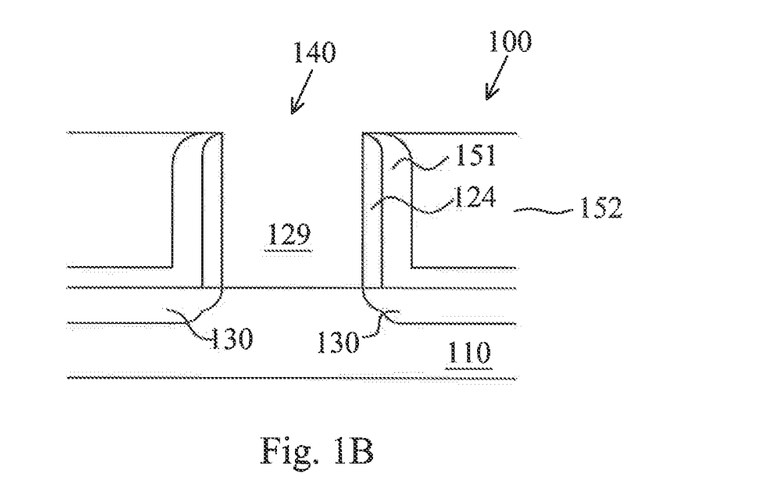
Figure 1C:
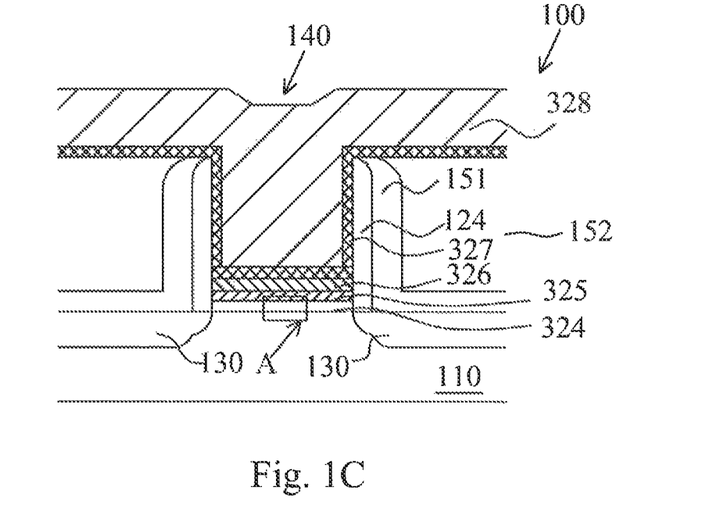

With reference to FIGS. 1A-1C, cross-sectional views of processing a semiconductor device structure 100 are described below, in accordance with some embodiments. The semiconductor device structure 100 is part of an integrated circuit, which may comprise memory cells and/or logic circuits. The integrated circuit of the semiconductor device structure 100 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional processing operations can be provided before, during, and/or after the sequence described below. Further, some of the operations described below can be replaced or eliminated, for additional embodiments of the processing sequence (or method). It is further understood that additional features can be added in the semiconductor device structure 100, and some of the features described below can be replaced or eliminated, for additional embodiments of the semiconductor device structure 100.

FIG. 1A shows a substrate 110. In the present embodiment, the substrate 110 is a semiconductor substrate comprising silicon. Alternatively, the substrate 110 may comprise an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition changes from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epitaxial (epi) layer. In other examples, the silicon substrate may include a multilayer compound semiconductor structure.

The substrate 110 may include various doped regions depending on design requirements (e.g., p-type wells or n-type wells). The doped regions may be doped with p-type dopants, such as boron or $BF_2$, and/or n-type dopants, such as phosphorus or arsenic. The doped regions may be formed directly on the substrate 110, in a P-well structure, in an N-well structure, in a dual-well structure, or using a raised structure. The semiconductor substrate 110 may further include various active regions, such as regions configured for an N-type metal-oxide-semiconductor transistor device (referred to as an NMOS) and regions configured for a P-type metal-oxide-semiconductor transistor device (referred to as a PMOS). For example, substrate 110 may have dopant regions and epitaxial layers formed to define source and drain regions. It is understood that the semiconductor device structure 100 may be formed by CMOS technology processing, and thus some processes are not described in detail herein.

Substrate 110 may also include isolation regions (not shown), which are formed to isolate various regions, such as NMOS and PMOS regions, of the substrate 110. The isolation regions utilize isolation technology, such as local oxidation of silicon (LOCOS) or shallow trench isolation (STI), to define and electrically isolate the various regions. If the isolation regions are made of STIs, each STI region comprises silicon oxide, silicon nitride, silicon oxynitride, other suitable materials, or combinations thereof. The STIs may be formed by any suitable process.

FIG. 1A further illustrates a gate structure 140, comprising a gate dielectric 114 and a gate electrode layer 116, which are formed by any suitable process. The gate dielectric layer 114 is formed over the substrate 110 by any suitable process to any suitable thickness. The gate dielectric layer 114, for example, may be made of silicon oxide, silicon oxynitride, silicon nitride, in-situ steam glass (ISSG), spin-on glass (SOG), fluorinated silica glass (FSG), carbon doped silicon oxide, BLACK DIAMOND® (from Applied Materials of Santa Clara, Calif.), Xerogel, Aerogel, amorphous fluorinated carbon, Parlyene, BCB (bis-benzocyclobutenes), SILK™ (from Dow Chemical, Midland, Mich.), polyimide, other suitable dielectric materials, or combinations thereof. In some embodiments, the gate dielectric layer 114 comprises a high-k dielectric material, such as $HfO_2$, HfSiO, HfSiON, HfTaO, HfTiO, HfZrO, other suitable high-k dielectric materials, and/or combinations thereof. The gate dielectric layer 114 can further include an interfacial layer, which comprises a grown silicon oxide layer (e.g., thermal oxide or chemical oxide) or silicon oxynitride (SiON), in accordance with some embodiments.

The gate electrode layer 116 is formed over the gate dielectric layer 114 by any suitable process to any suitable thickness. For example, the gate electrode layer 116 may be a polysilicon layer. The polysilicon (or poly) layer can be formed by chemical vapor deposition (CVD) or other suitable deposition process. In some embodiments, gate electrode layer 116 and the gate dielectric layer 114 are sacrificial (or dummy) layers and will be removed by a replacement step after a gate patterning process. In some other embodiments, the gate electrode layer 116 is a dummy layer and the gate dielectric layer 114 is not a dummy layer, which will not be removed by a replacement step after a gate patterning process.

Spacers 124 are formed to enclose sidewalls of the gate structure 140, in accordance with some embodiments. In an example, spacers 124 are formed by blanket depositing a dielectric layer over the gate structure 140 and the substrate 110, and then the dielectric layer is etched to form spacers 124. In some embodiments, the spacers 124 are formed of more than one layer of dielectric materials. The dielectric layer(s) used to form spacers 124 may comprise, for example, silicon nitride, silicon oxide, silicon carbide, silicon oxynitride, nitride silicon carbide (SiCN), other suitable materials, and/or combinations thereof. In some embodiments, spacers 124 include multiple layers and are formed by multiple deposition and etching processes.

FIG. 1A also shows a contact etch stop layer (CESL) 151 and an inter-metal dielectric layer (ILD0) before first metal layer is deposited. CESL 151 may be made of a dielectric material, such as silicon nitride, silicon oxynitride, or other suitable materials. CESL 151 has high etch selectivity in comparison with ILD0 152 and the gate dielectric layer 114 to allow proper contact etching. ILD0 152 is made of a dielectric material, such as an oxide, a doped oxide, a low-dielectric-constant (low-k) dielectric, or other suitable materials, and/or combinations thereof. The ILD0 152 may be made of, for example, silicon oxide, silicon oxynitride, silicon nitride, spin-on glass (SOG), fluorinated silica glass (FSG), carbon doped silicon oxide, BLACK DIAMOND®, Xerogel, Aerogel, amorphous fluorinated carbon, Parlyene, BCB (bis-benzocyclobutenes), SILK™, polyimide, other suitable dielectric materials, or combinations thereof. ILD0 152 may also be doped with a dopant, such as phosphorous (P), which can help getter ions.

In some embodiments, the semiconductor device structure 100 is a P-channel metal-oxide-semiconductor field-effect transistor (PMOSFET or PMOS) device. FIG. 1A shows that the semiconductor device structure 100 includes source and drain regions 130, which are doped with p-type dopants. The shape of the source and drain regions 130 shown in FIG. 1A is merely an example. Other shapes are also possible. Examples of p-type dopants may include boron (B), $BF_2$, or combinations thereof. Other p-type dopants may also be used.

FIG. 1A shows that the ILD0 152 and the CESL 151 are planarized to expose the gate electrode layer 116. The planarizing process can be a chemical-mechanical polishing (CMP) process. The planarization process removes excess ILD0 152 and CESL 151, and may continue until the excess ILD0 152 and CESL 151 on the gate structure 140 are removed.

As mentioned above, the gate electrode layer 116 and the gate dielectric layer 114 may both be dummy layers. The dummy gate electrode layer 116 and the gate dielectric layers are removed by etching to allow different material layers to be deposited in the opening created (or formed) by removing the dummy gate electrode layer. In some embodiments, the gate electrode layer 116 is a dummy layer, but the gate dielectric layer 114 is not a dummy layer and is not removed. The different material layers to be deposited in the opening may include, but are not limited to, an oxide dielectric layer, a high dielectric constant (high-k) dielectric layer, a barrier layer, a work function layer, a gate electrode (or gate metal) layer, etc. Exemplary details about the various material layers, methods, and structures used in forming a replacement gate structure(s) are described in U.S.

patent application Ser. No. 12/702,525, titled "Integration of Bottom-Up Metal Film Deposition" and filed on Feb. 9, 2010, U.S. patent application Ser. No. 12/872,642, titled "Modified Profile Gate Structure for Semiconductor Device and Methods of Forming Thereof" and filed on Aug. 31, 2010, and U.S. patent application Ser. No. 12/890,995, titled "Method and Apparatus For Improving Gate Contact" and filed on Sep. 27, 2010. The above mentioned patent applications are incorporated herein by reference in their entireties.

In order to replace the gate electrode layer 116 with other gate materials, the gate electrode layer 116 needs to be removed from gate structure 140 first. The gate electrode layer 116 may be removed by one or more wet and/or dry etching processes. For example, if the gate electrode layer 116 is made of polysilicon, a wet etching solution(s) used may be a diluted HF solution, an NH$_4$OH solution, or solutions involving both diluted HF and NH$_4$OH, in accordance with some embodiments. Other applicable chemistries may also be used to remove the dummy gate electrode layer 116. As mentioned above, the gate dielectric layer 114 could also be a dummy layer and could be removed. The gate dielectric layer 114 may be removed by one or more wet and/or dry etching processes.

FIG. 1B shows a cross-sectional view of the semiconductor device structure 100 after the dummy (or sacrificial) gate electrode layer 116 and the dummy (or sacrificial) gate dielectric layer 114 have been removed, in accordance with some embodiments. The removal of the gate electrode layer 116 and the gate dielectric 114 creates an opening 129 in the gate structure 140.

Figure 1D:
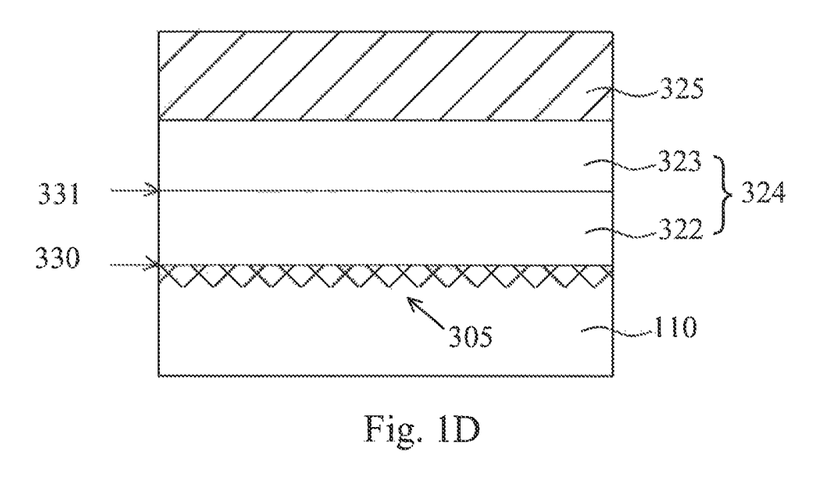
FIG. 1D shows an enlarged cross-sectional view of region "A" in FIG. 1C, in accordance with some embodiments.

After the dummy gate electrode layer 116 and the dummy gate dielectric layer 114 are removed, a number of gate material layer are deposited to fill opening 129. The number of gate material layers may include a gate dielectric layer 324, as shown in FIG. 1C. FIG. 1D shows an enlarged cross-sectional view of region "A" in FIG. 1C, in accordance with some embodiments. In some embodiments, the gate dielectric layer 324 includes an interfacial oxide layer 322 and a high dielectric constant (high-K) layer 323, as shown in FIG. 1D. Above the high-k dielectric layer there could be a barrier layer 325, which is used to protect the high-k layer 324. In some embodiments, there is a workfunction layer 326 above the barrier layer 325, as shown in FIG. 1C. The remaining portion of opening 129 is then filled with a gate electrode layer 328 (a conductive layer), such as aluminum, or other type of metal with low resistivity. A barrier/adhesion layer 327 could be deposited underneath the gate electrode layer 328.

The exemplary high-k dielectric materials that can be used to form the high-K dielectric layer 323 have been described above. The interfacial oxide layer 322 may made of silicon oxide or silicon oxynitride, and may be formed by a thermal process or by chemical oxide formation, in accordance with some embodiments. The gate dielectric layer 324, which includes the interfacial oxide layer 322 and the high-K dielectric layer 323, has a thickness in a range from about 20 Å to about 200 Å, in accordance with some embodiments. However, it could alternatively have some other thickness.

Since the semiconductor device structure 100 is a PMOS, the workfunction layer 326 is a p-type workfunction layer. Examples of materials for the p-type workfunction layer 326 include, but are not limited to, titanium nitride (TiN), tungsten (W), tungsten nitride (WN), or combinations thereof. In an alternative embodiment, the workfunction layer(s) may be omitted. Instead, the devices may be tuned to have an appropriate work function value using other methods known to the inventors. If the barrier layer 325 exists, the barrier layer 325 may be made of titanium, titanium nitride, tantalum, tungsten, aluminum, TaCN, TiAlN, TaSiN, WN, other suitable materials, and/or combinations thereof. The high-K dielectric layer 323 may be formed by atomic layer deposition (ALD), chemical vapor deposition (CVD), physical vapor deposition (PVD), plating, and/or other suitable methods.

In some embodiments, an optional barrier/adhesion layer 327 is deposited under the gate metal layer 328. The barrier/adhesion layer 327 and the gate metal layer 328 may be deposited by CVD, PVD, ALD, plating, and/or other suitable processes. The barrier/adhesion layer 327 can be made of Ti, TiN, Ta, TaN, or a combination of Ti/TiN or Ta/TaN, in accordance with some embodiments. The gate material layers described above are merely an example. Other types or numbers of gate material layers are also possible. After the opening 129 is filled, the excess conductive layers 327 and 328 above the ILD0 152 are removed. For example, the excess conductive layer 327 and 328 may be removed by a CMP process.

FIG. 1D shows a gate dielectric layer 324, which is composed of an interfacial layer 322 and a high-K dielectric layer 323, and a barrier layer 325 deposited over the gate dielectric layer 324. Alternatively, a workfunction layer 326 is deposited directly over the gate dielectric layer 324, in accordance with some embodiments. In some other embodiments, no workfunction layer 326 is used in the gate structure and a barrier/adhesion layer 327 is deposited directly over the gate dielectric layer 324. The formation of the interfacial oxide layer 322 results in dangling Si— bonds and weak Si—H bonds at the silicon/silicon-oxide interface 330, which can become interface traps 305 when a negative voltage is applied to the gate of a PMOS device for a prolonged time.

The advanced semiconductor process technologies that are used to produce small transistors increase the potential for interface traps in PMOS transistors during prolonged times of negative bias stress. An interface trap at the silicon/silicon-oxide interface 330 is created when a negative voltage is applied to the gate of a P-channel metal-oxide-semiconductor field-effect transistor (PMOSFET or PMOS) device for a prolonged time. The interface trap is located near the Si-oxide/S-crystal lattice boundary where holes, which are positively charged, can get stuck, and in doing so, they shift the threshold voltage (Vt). This phenomenon is called PMOS negative bias temperature instability (NBTI). NTBI is a test that helps in determining (or estimating) the useful lifetime of complementary metal-oxide semiconductor (CMOS) devices. To perform an NBTI test of a PMOS transistor, a constant negative bias is applied to the gate electrode at high temperatures, with source, drain, and the substrate being grounded. Vt shift is then measured. NTBI may be used to predict CMOS device lifetime. The performance of PMOS NTBI is worse for advanced technology nodes, because the transistor dimensions are smaller, the electric field applied to the gate dielectric has increased, and the operating voltage has become lower for advanced technology nodes.

It is believed that reducing the number of interfacial traps (or sites) 305 can result in improved NTBI performance. Interfacial traps can be reduced by annealing. However, the anneal temperature and thermal budget need to be carefully limited and controlled to ensure no significant modification to the dopant profiles to device structures on substrate 110, including PMOS, NMOS, and other devices. The anneal temperature cannot be too low in order for the anneal to be effective in reducing interfacial traps (or sites).

In addition to the silicon/silicon-oxide interface 330, there is an interface 331 between the interfacial oxide layer 322 and the overlying high-K dielectric layer 323. The interfacial oxide and the high-K dielectric material can form dipoles. For example, if the high-K layer is made of $HfO_2$, the Si in the interfacial oxide layer 322 (made of $SiO_2$) and the Hf in the $HfO_2$ can form Hf—Si dipoles, which also may contribute to Vt shift. The elimination or reduction of such dipoles would improve the PMOS NTBI performance. The dipoles at the interface 331 between the interfacial oxide layer 322 and the high-K-dielectric layer 323 may be reduced or eliminated by improving or increasing the intermixing of the interfacial oxide layer 322 and the high-K dielectric layer 323. The intermixing of these two layers can be improved by thermal annealing, which can be performed at a temperature lower than the anneal temperature to reduce interface traps. The anneal temperature and its thermal budget should also be controlled to minimize its impact on the dopant profiles.

Figure 1E:
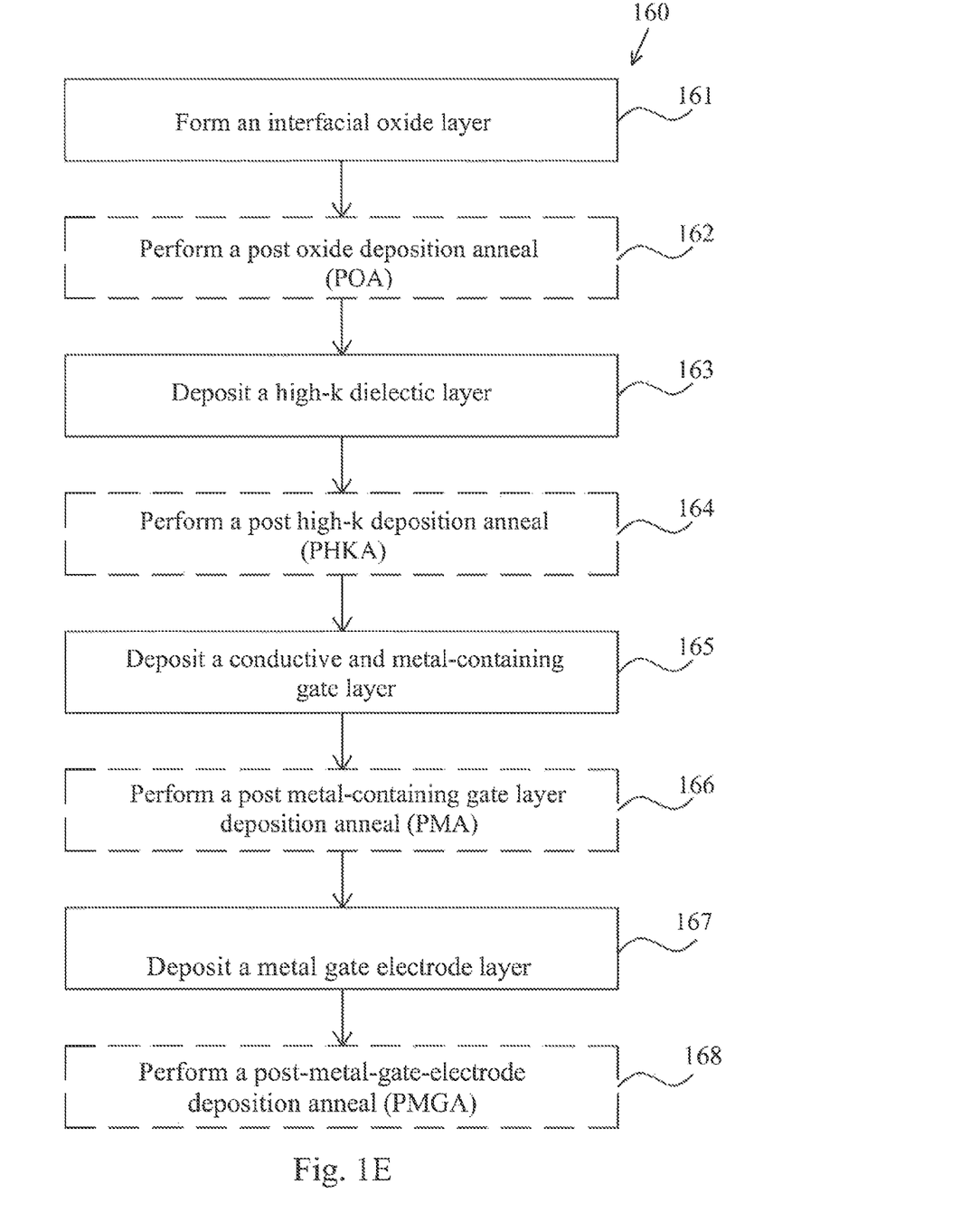
FIG. 1E shows a process flow of forming a gate structure, in accordance with some embodiments.

FIG. 1E shows a process flow 160 of forming (or filling) at least a portion of the gate structure 140, in accordance with some embodiments. The process flow 160 describes the sequence of processes performed in forming the gate material layers near the silicon substrate surface. At operation 161, the interfacial oxide layer 322 is formed by a thermal process, in accordance with some embodiments. FIG. 1B shows that the gate dielectric layer 114 is removed and the opening 129 needs to be filled. Prior to thermally growing the interfacial oxide layer 322, the silicon surface may be wet cleaned by a solution containing $H_2SO_4$, HF and possibly other ingredients. The thermal process to grow the interfacial oxide layer 322 may be performed at a temperature in a range from about 600° C. to about 900° C. in an environment with $O_2$, steam, or a combination of both. Alternatively, the interfacial oxide layer 322 may be formed after wet clean as a native oxide. In some embodiments, the thickness of the interfacial oxide layer 322 is in a range from about 5 Å to about 100 Å.

After the oxide layer is formed, an optional post oxide-deposition anneal (POA) 162 may be performed in accordance with some embodiments. The POA anneal may be used to reduce the interfacial traps 305 described above. Afterwards, the high-K dielectric layer 323 is deposited at operation 163. The high-K dielectric layer 323 may be deposited by an ALD process, in accordance with some embodiments. In some embodiments, the thickness of the high-K dielectric layer 323 has a thickness in a range from about 10 Å to about 100 Å.

After the high-K dielectric layer is deposited, a post-deposition (of the high-K dielectric layer 323) anneal may be performed at operation 164, in accordance with some embodiments. The optional post-HK-deposition anneal (PHKA) may be used to replace the POA described above to reduce silicon/oxide interfacial traps 305 described above. In addition, PHKA may improve the interfacial mixing between the interfacial oxide layer 322 and the high-K dielectric layer 323. Alternatively, both POA and PHKA may be used together to reduce silicon/oxide interfacial traps 305 and to improve inter-mixing respectively. Afterwards, deposition of a conductive and metal-containing gate layer is performed at operation 165. The conductive and metal-containing gate layer deposited can be the barrier layer 325, the workfunction layer 326, or the barrier/adhesion layer 327 described above. An optional post-metallic-containing-gate-layer-deposition anneal (PMA) operation 166 may be performed after operation 165, in accordance with some embodiments. The PMA operation 166 may be used to replace the POA described above to reduce silicon/oxide interfacial traps 305 described above. In addition, PMA may improve the interfacial mixing between the interfacial oxide layer 322 and the high-K dielectric layer 323. Alternatively, both POA and PMA may be used together to reduce silicon/oxide interfacial traps 305 and to improve inter-mixing respectively.

Afterwards, a metal gate electrode layer 328 is deposited on the gate structure at operation 167, in accordance with some embodiments. There could be additional deposition process(es) between the deposited metallic-containing layer, which may be layer 325, 326, or 327, and the metal gate electrode layer 328. For example, if a barrier layer 325 is deposited at operation 164, a workfunction layer 326 and/or a barrier/adhesion layer 327 may be deposited on the gate structure before the metal gate electrode (MGE) layer 328 is deposited. An optional post-metal-gate-electrode-deposition anneal (PMGA) operation 168 may be performed after operation 167, in accordance with some embodiments. The PMGA operation 168 may be used to replace the POA described above to reduce silicon/oxide interfacial traps 305 described above. In addition, PMGA may improve the interfacial mixing between the interfacial oxide layer 322 and the high-K dielectric layer 323. Alternatively, both POA and PMGA may be used together to reduce silicon/oxide interfacial traps 305 and to improve inter-mixing respectively. More processing operations, such as the operations to remove excessive conductive layer(s) above ILD0 152, may follow. Alternatively, the PMGA may be performed after the excessive conductive layer(s) above ILD0 152 have been removed.

To prevent significant diffusion of dopants, such as B, As (Arsenic), P (Phosphorus), etc., the peak anneal temperature should be equal to or less than about 1010° C. for rapid thermal anneal (RTA). The duration of such RTA, or rapid thermal processing (RTP) anneal, is affected by the anneal temperature. For a higher anneal temperature, the anneal time should be kept lower. In some embodiments, the RTA duration is equal to or less than about 60 seconds. For example, the POA, PHKA, PMA, or PMGA process described above may be performed at a temperature in a range from about 750° C. to about 850° C. for a duration in a range from about 5 seconds to about 60 seconds, in accordance with some embodiments. If millisecond anneal (or flash anneal) is used to reduce interfacial traps 305, the peak anneal temperature could be higher than the RTA temperature due to its shorter anneal time. In some embodiments, the peak anneal temperature is equal to or less than about 1250° C. The duration of the millisecond anneal is equal to or less than about 40 milliseconds, in accordance with some embodiments.

As mentioned above, the anneal operation to improve intermixing between the high-K dielectric layer 323 and the interfacial oxide layer 322 may be carried out at a lower temperature than the anneal temperature required to reduce silicon/oxide interfacial traps 305. In some embodiments, the temperature for improving intermixing in a range from about 600° C. to about 950° C. The duration of such anneal may be in a range from about 2 seconds to about 60 seconds.

Figure 2A:
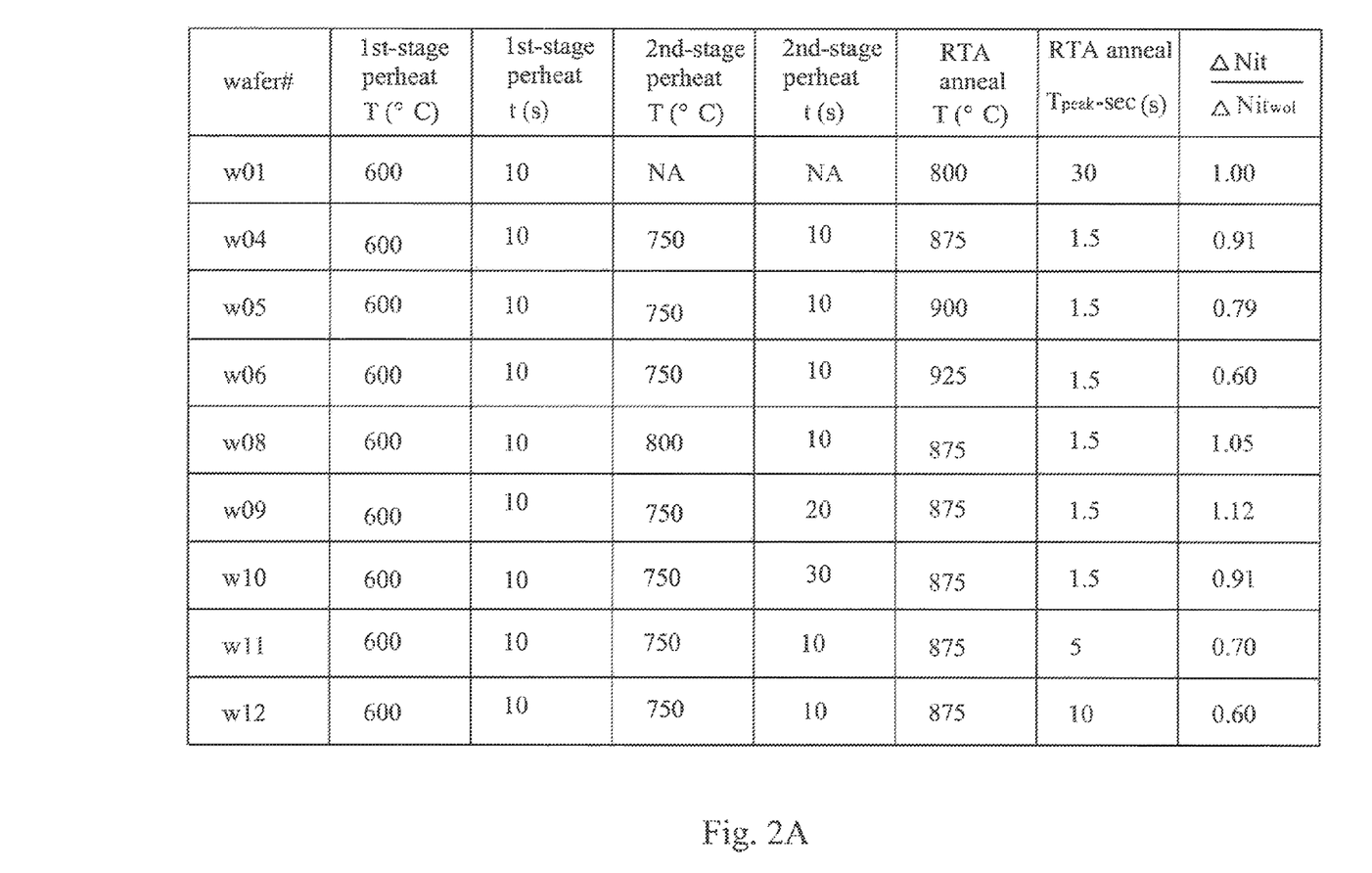
FIG. 2A shows ΔNit results of various 2-stage preheat spike anneal processes compared with a reference anneal process, in accordance with some embodiments
Figure 2B:
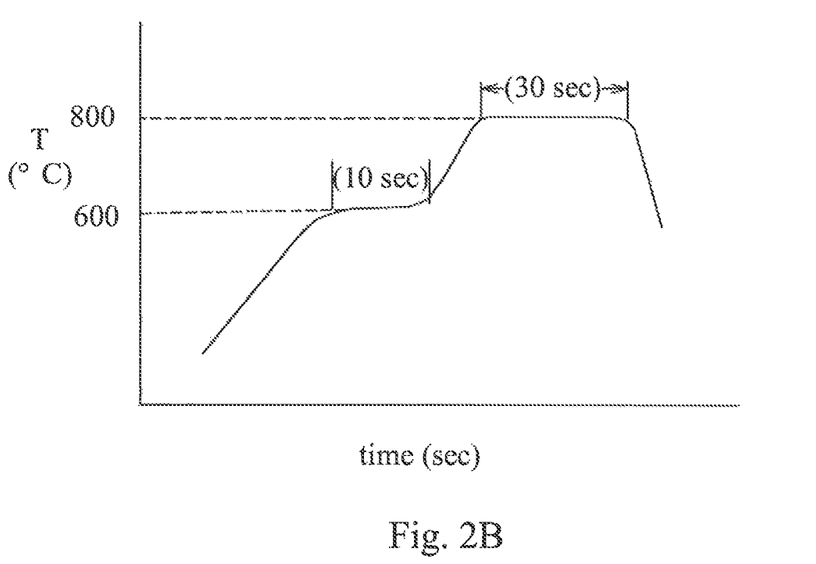
FIG. 2B shows a schematic diagram of rapid thermal anneal (RTA) temperature profile for the reference wafer, in accordance with some embodiments.

FIG. 2A shows different anneal splits with their corresponding densities of interfacial sites compared to a reference anneal process, in accordance with some embodiments. The density of interfacial sites is measured by ΔNit (or Delta Nit), which is measured by an HP8110A Pattern Generator and an HP4156B Parameter Analyzer, both made by Agilent Technologies Inc. of Palo Alto, Calif. Delta Nit measures the Nit difference between a fresh device and an electrically stressed device. Lower ΔNit reflects lower density of the interfacial traps (or sites). The information in FIG. 2A includes a reference wafer (w01), which uses a process flow described in FIG. 1E of with an RTA after the high-K dielectric layer deposition (or PHKA) at a temperature in a range from about 750° C. to about 850° C. for a duration in a range from about 5 seconds to about 60 second. FIG. 2B shows a schematic diagram of RTA temperature profile for w01 (the reference wafer), in accordance with some embodiments. FIG. 2B shows that the reference wafer (w01) is heated up to a preheat temperature of 600° C. for 10 seconds to warm up the substrate. Afterwards, the wafer temperature is then quickly raised (or spiked) to and anneal temperature 800° C. for 30 seconds.

Based on studies, anneal processes using a multi-stage (i.e. 2 or more stages) preheat with a high temperature anneal have potentials in achieving goals of reducing interfacial sites, improving NTBI performance, improving intermixing between high-K dielectric layer and interfacial oxide layer, and reducing Vt shift. The multi-stage preheat is designed to reduce dopant deactivation by preventing exposing the wafers to high anneal temperature for an extended period of time. The multi-stage preheat also assists intermixing between the interfacial oxide layer 322 and the high-K dielectric layer 323 to reduce dipoles and to provide effective defect recovery of the high-K dielectric layer with the goal of reducing Vt shift. The multi-stage preheat is followed by a high temperature anneal to reduce the number of the interfacial traps 305.

In some embodiments, the anneal operation utilizes a 2-stage pre-heat spike anneal. Spike anneal is an alternative terminology for a rapid thermal processing (RTP) anneal. The first preheat may be at a temperature and a duration similar to those of the reference wafer, w01, which is at a temperature is in a range from about 400° C. to about 600° C. with a duration in a range from about 2 seconds to about 20 seconds, in some embodiments. As mentioned above, the first preheat is mainly used to warm up the substrate. The wafer then undergoes a second pre-heat at a temperature in a range from about 700° C. at about 850° C. for a duration in a range from about 4 second to about 20 seconds. After the second stage preheat is completed, the wafer then undergoes a higher temperature spike anneal, which is an RTA. In some embodiments, the high temperature anneal is performed in a range from 875° C. to 1010° C. for a $T_{peak-50C}$ duration in a range from about 0.5 seconds to about 5 seconds. $T_{peak-50C}$ measures the time it takes to raise the temperature to the 50° C. near peak temperature. The duration of lower spike anneal temperatures can be extended longer than spike anneal at higher temperature. For example, when the spike anneal temperature is at 925° C., the anneal duration ($T_{Peak-50C}$) may be in a range from about 0.5 second to about 2.5 seconds without causing significant dopant diffusion. If the spike anneal temperature is at 875° C., the anneal duration ($T_{Peak-50C}$) may be in a range from about 1 second to about 5 seconds without causing significant dopant diffusion.

Figure 2C:
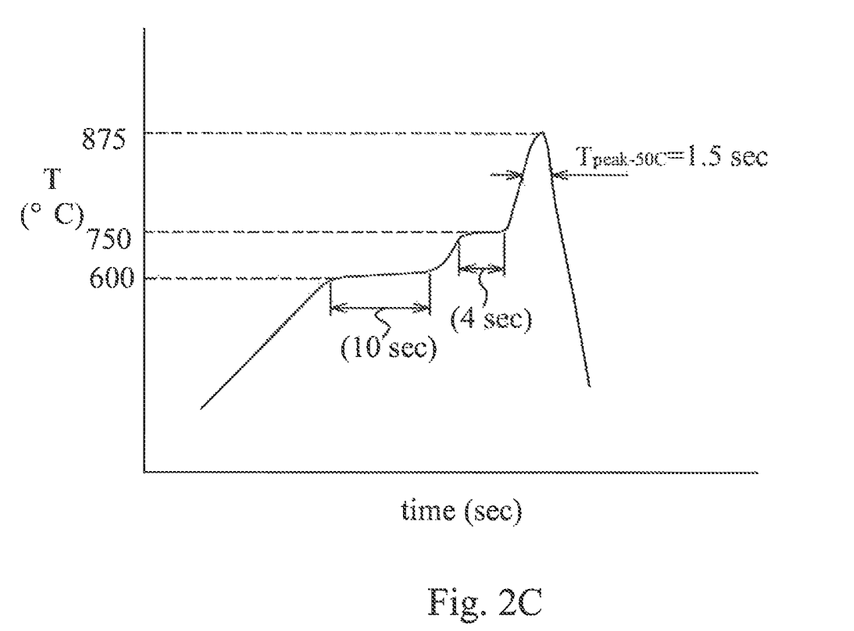
FIG. 2C shows a schematic diagram of the RTA temperature profile for a wafer undergoing anneal processes, in accordance with some embodiments.

Wafers w04-w12 are processed with 2-stage preheat spike anneal under different process conditions. FIG. 2C shows a schematic diagram of the RTA temperature profile for wafer w04, in accordance with some embodiments. After wafer w04 undergoes a first preheat at 600° C. for 10 seconds, and second preheat 750° C. for 10 seconds, the spike anneal is performed with a peak temperature at 875° C. for a $T_{peak-50C}$ duration of 1.5 seconds. The exemplary diagram of the RTA temperature profile of FIG. 2C also applies to other wafers that undergo 2-stage preheat spike anneal in FIG. 2A with different temperatures and durations in the second preheat and/or spike anneal stages. The experiments included in FIG. 2A do not vary the process condition of the first stage preheat.

The ΔNit results of wafers w04-w12 are compared against wafer w01 in FIG. 2A. When the second stage preheat (also a form of anneal) is performed at 750° C. for 10 seconds, the results show that the higher temperature of the spike anneal reduces more interfacial sites (i.e., lower ΔNit). Wafer w06 with the spike anneal at 925° C. has a lower ΔNit lower compared wafers w04 and w05, which are annealed at lower spike anneal temperatures (875° C. and 900° C., respectively). The results in FIG. 2A also indicate that increasing the second stage preheat temperature from 750° C. to 800° C. worsens the ΔNit result. Such observation can be concluded by comparing the ΔNit data of wafers w04 and w06.

Wafers w09 and w10 are annealed with longer second stage preheat time compared to wafer w04 to study the effect of second stage preheat time. The results show equivalent results for preheat duration of 10 seconds and 30 seconds when the $2^{nd}$ stage preheat temperature is at 750° C. Worse performance is observed when the preheat duration is 20 seconds. Wafers w11 and w12 are annealed with longer spike anneal duration compared to wafer w04 to study the effect of $2^{nd}$ stage anneal time. The results show that longer spike anneal time helps to reduce interfacial sites when the spike anneal temperature is at 875° C. Similar studies have not been conducted for spike anneal temperature at 925° C. due to its relatively high temperature, which could induce significant dopant diffusion with extended duration of anneal.

The results in FIG. 2A show promising reduction of interfacial sites (about 40% reduction) for second stage preheat at 750° C. for 10 seconds and spike anneal (or RTA) at either 925° C. for $T_{peak-50C}$ of 1.5 seconds or 875° C. for 10 seconds in comparison with the reference of a single-stage preheat RTA at a peak anneal temperature of 800° C. for 30 seconds. PMOS and NMOS device performance studies of two-stage (or 2-stage) anneal of wafers processed under the same anneal processes of w06 and w12 show no degradation of device performance in comparison to the reference process condition of using a single stage preheat spike anneal at a peak temperature in a range from about 750° C. to about 850° C. for a duration in a range from about 5 seconds to about 60 seconds.

Figure 3A:
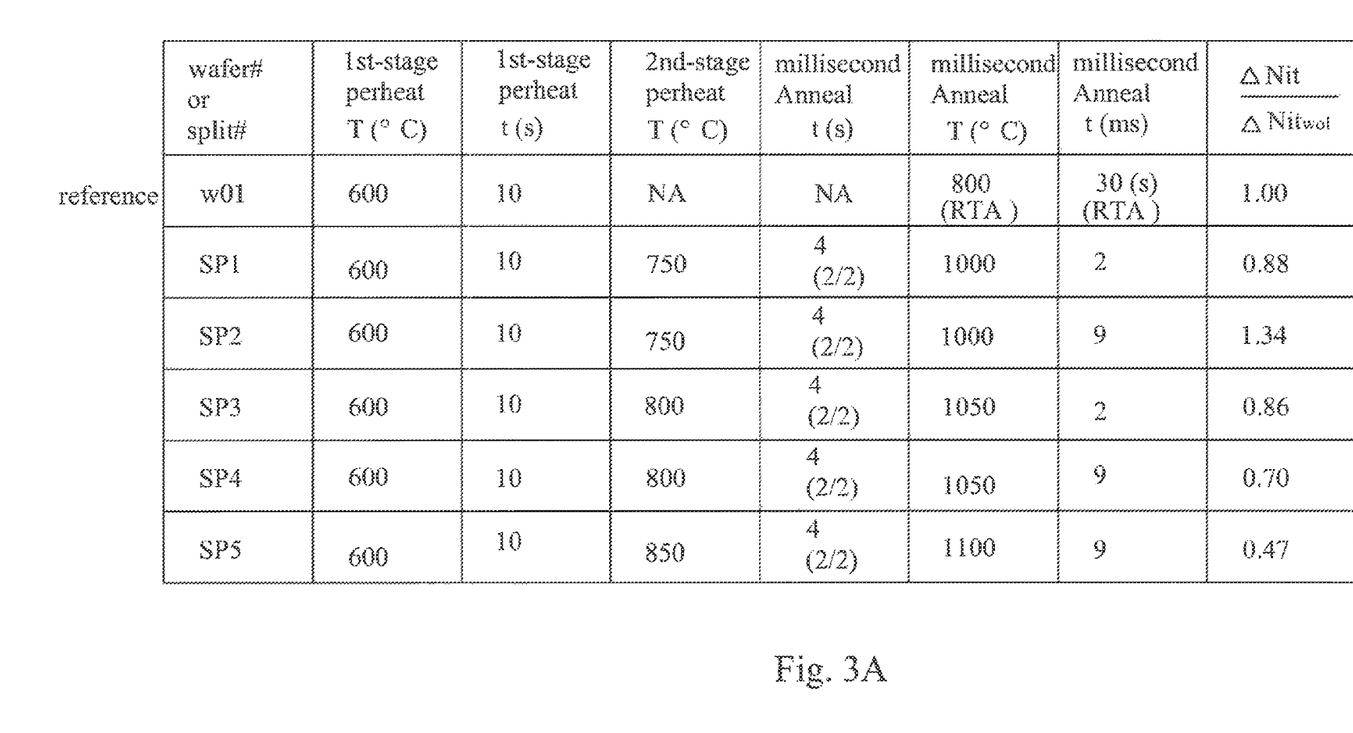
FIG. 3A shows ΔNit results of various 2-stage preheat millisecond anneal processes compared with a reference anneal process, in accordance with some embodiments.

In some embodiments, the anneal operations utilize a 2-stage pre-heat millisecond anneal. FIG. 3A shows ΔNit study of various 2-stage preheat millisecond anneal processes and one reference process, in accordance with some embodiments. The reference process is the same process used for w01 in FIG. 2A with a single stage preheat with a spike anneal at 800° C. for 30 seconds after the deposition of the high-K dielectric layer (PHKA) as described above. The first preheat of the wafers studied may be at a temperature and a duration similar to those of the reference wafer, w01, which is at a temperature in a range from about 400° C. to about 600° C. with a duration in a range from about 2 seconds to about 20 seconds, in some embodiments. As mentioned above, the first preheat is mainly used to warm up the substrate. The wafer then undergoes a second pre-heat at a temperature in a range from about 700° C. at about 900° C. for a duration in a range from about 1 second to about 20 seconds. During the half point of the second stage preheat, the temperature of the wafer is quickly raised to the peak anneal temperature by millisecond anneal. For example, if the preheat duration during the second stage preheat is 4 seconds, the wafer temperature is raised to peak anneal temperature after 2 seconds of the second stage preheat. Flash anneal lamps, such as xenon (Xe) arc lamps or argon (Ar) arc lamps, may be used to achieve such a rapid temperature rise. The second stage preheat continues for another 2 seconds. The peak temperature for the millisecond anneal is in a range from about 950° C. to about 1200° C. for a duration in a range from about 1 milliseconds (ms) to about 40 ms, in accordance with some embodiments.

Figure 3B:
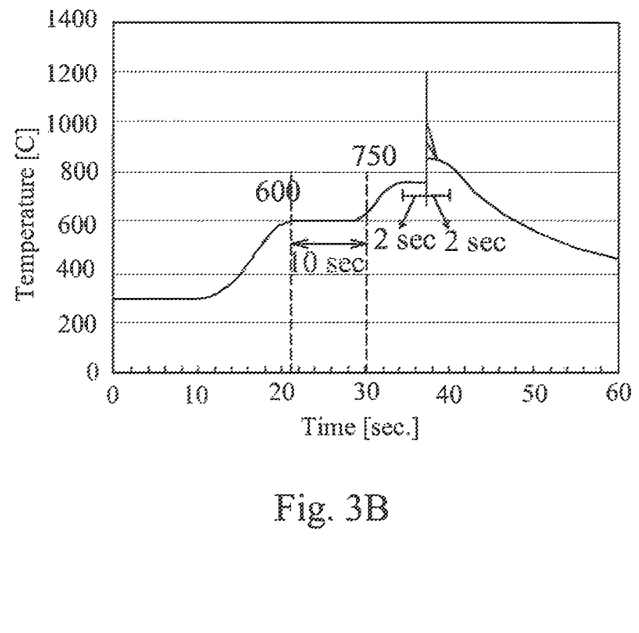
FIG. 3B shows a temperature diagram of a 2-stage preheat millisecond anneal process, in accordance with some embodiments.
Figure 3C:
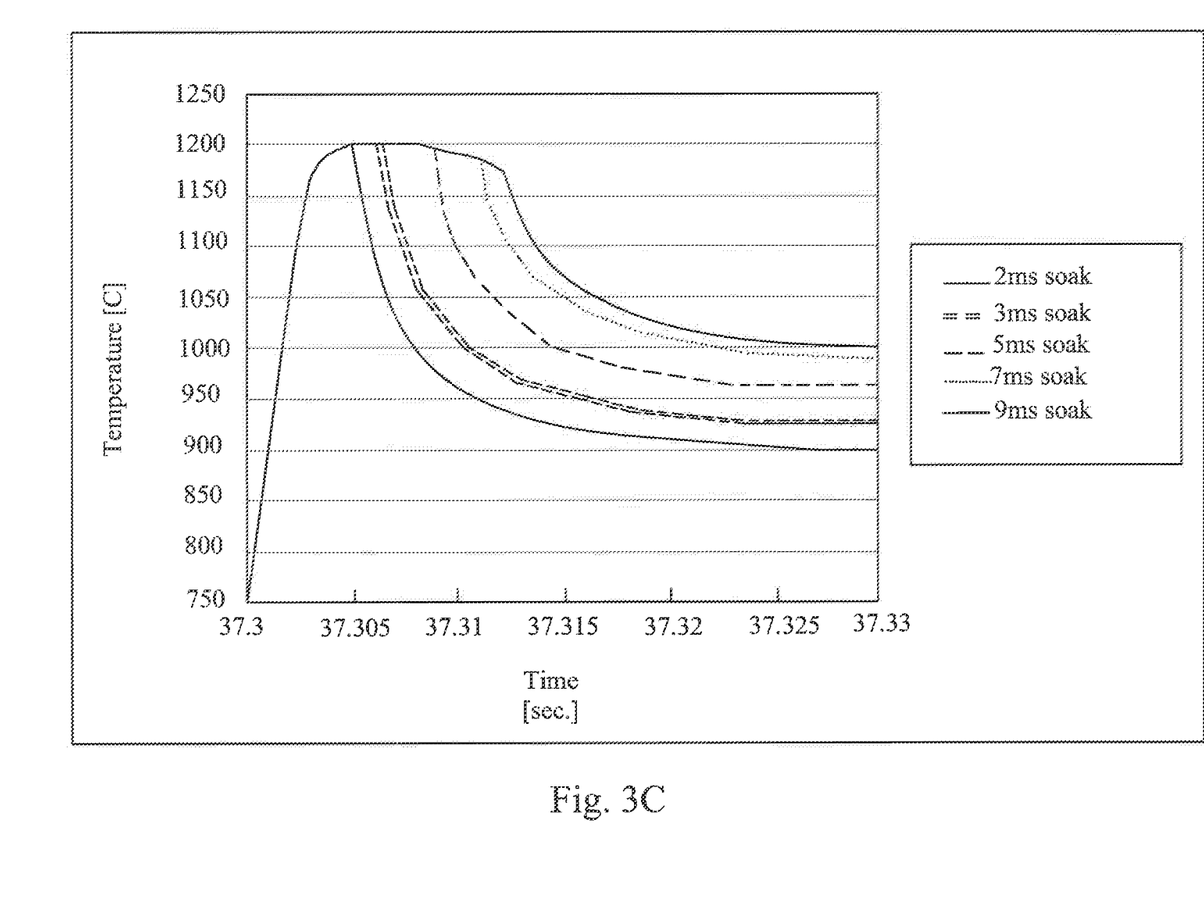
FIG. 3C shows different temperature profiles of millisecond anneal processes in FIG. 3B with "soak" time varying from 2 ms to 9 ms, in accordance with some embodiments.

FIG. 3B shows a temperature diagram of a 2-stage preheat millisecond anneal, in accordance with some embodiments. The millisecond anneal (or flash anneal) portion of FIG. 3B includes profiles of multiple millisecond anneal times (or soak times) from 2 ms to 9 ms with the peak temperature targeted at 1200° C. The substrate is pre-heated to 600° C. and is held for 10 seconds at 600° C. Afterwards, the substrate is raised to 750° C. and is maintained at 750° C. for 4 seconds. As mentioned above, the second stage preheat continues for another 2 seconds. In the middle of the second stage preheat, the millisecond anneal is performed. FIG. 3C shows different temperature profiles of millisecond anneal operations in FIG. 3B with the anneal (or soak) times varying from 2 ms to 9 ms, in accordance with some embodiments.

The results, which are all compared against the reference w01, show that when a second stage preheat is at 750° C. for 4 seconds (or 2 seconds before flash anneal and 2 seconds after flash anneal), a 9 milliseconds (or ms) anneal at 1000° C. produces a ΔNit result about 12% better than the reference wafer (or ΔNit of 0.88 or 88% of the reference wafer). In contrast, a 2 ms anneal at 1000° C. produces a ΔNit result 34% worse than the reference wafer (or ΔNit of 1.88 or 134% of the reference wafer). The results also show that by increasing the second preheat temperature from 750° C. to 800° C. and increasing the millisecond-anneal temperature from 1000° C. to 1050° C. with the flash anneal time of 2 ms, the ΔNit result is improved by about 14% (or ΔNit of 0.86 or 86% of the reference wafer). This result is very close to the result of 9 ms anneal at 1000° C. with a second preheat at 750° C. When the duration of the millisecond-anneal (or flash anneal) at 1050° C. is lengthened to 9 ms, the ΔNit is further reduced to about 70% of the reference wafer (or 30% reduction or improvement).

The best ΔNit result is observed when the second preheat is at 850° C. and the flash (or millisecond) anneal is at 1100° C. for 9 ms. This result achieves a 53% reduction in ΔNit and is even lower than the best result for 2-stage preheat spike anneal (RTA), which achieves a 40% reduction in ΔNit when compared to the reference wafer. Although the peak anneal temperature for the millisecond anneal is higher than the peak temperature of spike anneal (1100° C. vs. 925° C.), the short anneal time of the millisecond anneal does not cause significant dopant diffusion. Additional studies of NTBI measurement of a 2-stage preheat millisecond anneal with a second stage preheat at 850° C. for 4 seconds with a 1100° C. millisecond anneal for 2 ms show a 2× improvement in NTBI performance of the 2-stage anneal in comparison to the reference wafer.

The 2-stage preheat high-temperature anneal described above may be performed after the interfacial oxide layer 322 is formed (or POA) or after high-K dielectric layer 323 is deposited over the interfacial layer 322 (or PHKA). In some embodiments, such an anneal operation is performed after a conductive and metal-containing gate layer (325, 326, or 327) is deposited (or PMA). In some other embodiments, such an anneal operation is performed after the metal gate electrode 328 is deposited (PMGA). Further, such anneal may be performed after the excess conductive layer(s), such as the gate electrode layer 328 and/or the barrier/adhesion layer 327, are removed from the substrate by a removal process, such as CMP.

Although the multi-stage preheat high-temperature anneal process for gate formation described above is used in forming a replacement gate, the anneal may also be used in a gate first process to reduce interfacial sites between silicon and a gate dielectric layer, to reduce Vt shift, and to improve PMOS NTBI performance. The anneal may also be used in a gate first process with a high-K dielectric layer deposited over an oxide layer, which may be made of silicon oxide, silicon oxynitride, or a combination of both, to reduce interfacial traps at the Si/oxide interface and to improve intermixing between the high-K dielectric layer with the oxide layer.

The described embodiments of multi-stage preheat high-temperature anneal after the deposition of the gate dielectric layer(s) reduce the number of interfacial sites and improve the NTBI performance of PMOS. The gate dielectric layers may include an interfacial oxide layer and a high-k dielectric layer. The multi-stage preheat is designed to reduce dopant deactivation and to improve inter-mixing between the interfacial oxide layer and the high-k dielectric layer. The high-temperature anneal is used to reduce the number of interfacial sites at interface between the silicon substrate and the interfacial oxide layer.

One aspect of this description relates to a method of fabricating a gate structure. The method includes depositing a high dielectric constant (high-k) dielectric layer over a substrate. The method further includes performing a multi-stage preheat high-temperature anneal. Performing the multi-stage preheat high-temperature anneal includes performing a first stage preheat at a temperature in a range from about 400° C. to about 600° C., performing a second stage preheat at a temperature in a range from about 700° C. to about 900° C., and performing a high temperature anneal at a peak temperature in a range from 875° C. to about 1200° C.

Another aspect of this description relates to a method of fabricating a gate structure. The method includes forming a high dielectric constant (high-k) dielectric layer over a substrate. The method further includes performing a multi-stage preheat millisecond anneal. Performing the multi-stage preheat millisecond anneal includes performing a first stage preheat at a temperature in a range from about 400° C. to about 600° C. for a duration in a range from about 2 seconds to about 20 seconds, performing a second stage preheat at a temperature in a range from about 700° C. to about 900° C. for a duration in a range from about 1 second to about 20 seconds, and performing a millisecond anneal at a peak temperature in a range from 950° C. to about 1200° C. for a duration in a range from about 1 millisecond (ms) to about 40 ms.

Still another aspect of this description relates to a method of fabricating a gate structure on a wafer. The method includes forming a high dielectric constant (high-k) dielectric layer over a substrate. The method further includes performing a multi-stage preheat millisecond anneal. Performing the multi-stage preheat millisecond anneal includes preheating the wafer at a first temperature in a range from about 400° C. to about 600° C. for a duration in a range from about 2 seconds to about 20 seconds, preheating the wafer at a second temperature range from about 700° C. to about 900° C. for a duration in a range from about 1 second to about 20 seconds, and annealing the wafer using a millisecond anneal a peak temperature in a range from 950° C. to about 1200° C. for a duration in a range from about 1 ms to about 40 ms. Annealing the wafer includes annealing the wafer at a mid-point of the duration of preheating the wafer at the second temperature.

Accordingly, the present disclosure provides a method of forming a replacement gate structure. While the formation has been disclosed as directed to a metal gate last process, a high-k gate dielectric last process, and/or other embodiments, the present disclosure may benefit any semiconductor process. While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a gate structure, the method comprising:
    depositing a high dielectric constant (high-k) dielectric layer over a substrate; and
    performing a multi-stage preheat high-temperature anneal, wherein performing the multi-stage preheat high-temperature anneal comprises:
        performing a first stage preheat at a temperature in a range from about 400° C. to about 600° C.,
        performing a second stage preheat at a temperature in a range from about 700° C. to about 900° C., and
        performing a high temperature anneal at a peak temperature in a range from 875° C. to about 1200° C.

2. The method of claim 1, wherein performing the high temperature anneal comprises performing a millisecond anneal for a duration in a range of about 1 millisecond (ms) to about 40 ms.

3. The method of claim 1, wherein performing the high temperature anneal comprises performing a spike anneal process.

4. The method of claim 3, wherein performing the spike anneal process comprises maintaining the substrate at a temperature within 50-degrees of the peak temperature for a duration ranging from about 0.5 seconds to about 5 seconds.

5. The method of claim 1, further comprising forming an interfacial layer between the substrate and the high-k dielectric layer, wherein performing the multi-stage preheat high-temperature anneal comprises reducing a number of interfacial traps at an interface between the substrate and the interfacial layer.

6. The method of claim 1, further comprising forming a gate electrode over the high-k dielectric layer, wherein forming the gate electrode comprises:
    forming a workfunction layer over the high-k dielectric layer;
    forming a barrier layer over the workfunction layer; and
    forming a metal gate electrode layer over the barrier layer.

7. The method of claim 6, wherein the multi-stage preheat high-temperature anneal is performed prior to forming the metal gate electrode layer.

8. The method of claim 6, further comprising performing a chemical mechanical planarization (CMP) process to remove excess material of the workfunction layer, the barrier layer and the metal gate electrode layer.

9. The method of claim 8, wherein the multi-stage preheat high-temperature anneal is performed after the CMP process.

10. A method of fabricating a gate structure, the method comprising:
    forming a high dielectric constant (high-k) dielectric layer over a substrate; and
    performing a multi-stage preheat millisecond anneal, wherein performing the multi-stage preheat millisecond anneal comprises:
        performing a first stage preheat at a temperature in a range from about 400° C. to about 600° C. for a duration in a range from about 2 seconds to about 20 seconds,
        performing a second stage preheat at a temperature in a range from about 700° C. to about 900° C. for a duration in a range from about 1 second to about 20 seconds, and
        performing a millisecond anneal at a peak temperature in a range from 950° C. to about 1200° C. for a duration in a range from about 1 millisecond (ms) to about 40 ms.

11. The method of claim 10, further comprising forming an interfacial layer between the substrate and the high-k dielectric layer, wherein performing the multi-stage preheat millisecond anneal comprises reducing a number of interfacial traps at an interface between the substrate and the interfacial layer.

12. The method of claim 10, further comprising forming a gate electrode over the high-k dielectric layer, wherein forming the gate electrode comprises:
    forming a workfunction layer over the high-k dielectric layer;
    forming a barrier layer over the workfunction layer; and
    forming a metal gate electrode layer over the barrier layer.

13. The method of claim 12, wherein the multi-stage preheat millisecond anneal is performed after forming the barrier layer and prior to forming the metal gate electrode layer.

14. The method of claim 12, further comprising performing a chemical mechanical planarization (CMP) process to remove excess material of the workfunction layer, the barrier layer and the metal gate electrode layer.

15. The method of claim 14, wherein the multi-stage preheat millisecond anneal is performed after the CMP process.

16. The method of claim 10, wherein performing the second stage preheat comprises performing a first portion of the second stage preheat prior to the millisecond anneal, and performing a second portion of the second stage preheat after the millisecond anneal.

17. The method of claim 16, wherein performing the first portion of the second stage preheat comprises performing the first portion of the second stage preheat at a first temperature, and performing the second portion of the second stage preheat comprises performing the second portion of the second stage preheat at a second temperature higher than the first temperature.

18. A method of fabricating a gate structure on a wafer, the method comprising:
    forming a high dielectric constant (high-k) dielectric layer over a substrate; and
    performing a multi-stage preheat millisecond anneal, wherein performing the multi-stage preheat millisecond anneal comprises:
        preheating the wafer at a first temperature in a range from about 400° C. to about 600° C. for a duration in a range from about 2 seconds to about 20 seconds,
        preheating the wafer at a second temperature range from about 700° C. to about 900° C. for a duration in a range from about 1 second to about 20 seconds, and annealing the wafer using a millisecond anneal a peak temperature in a range from 950° C. to about 1200° C. for a duration in a range from about 1 ms to about 40 ms, wherein annealing the wafer comprises annealing the wafer at a mid-point of the duration of preheating the wafer at the second temperature.

19. The method of claim 18, wherein preheating the wafer at the second temperature range comprises preheating the wafer for a first duration at a first temperature prior to the millisecond anneal, and preheating the wafer for a second duration at a second temperature after the millisecond anneal, wherein the first temperature is less than the second temperature.

20. The method of claim 18, further comprising:
forming a workfunction layer over the high-k dielectric layer; and
forming a metal gate electrode layer over the workfunction layer, wherein the multi-stage preheat millisecond anneal is performed after forming the workfunction layer and prior to forming the metal gate electrode.

* * * * *